United States Patent [19]

Renoult et al.

[11] Patent Number: 4,616,194

[45] Date of Patent: Oct. 7, 1986

[54] PIEZOELECTRIC OSCILLATOR WITH CRYSTAL FILTER AND TEMPERATURE COMPENSATION

[75] Inventors: Patrick Renoult, Paris; Gérard Marotel, Sartrouville, both of France

[73] Assignee: Compagnie d'Electronique et de Piezo-Electricite C.E.P.E., Argenteuil, France

[21] Appl. No.: 715,822

[22] Filed: Mar. 25, 1985

[30] Foreign Application Priority Data

Mar. 27, 1984 [FR] France .................. 84 04746

[51] Int. Cl.[4] .................. H03B 5/36; H03L 1/02
[52] U.S. Cl. .................. 331/116 R; 331/162; 331/176
[58] Field of Search ............. 331/116 R, 116 FE, 162, 331/176, 158

[56] References Cited

U.S. PATENT DOCUMENTS 3,372,348 3/1968 Feit .................. 331/116 R
4,484,157 11/1984 Helle et al. .................. 331/116 R

FOREIGN PATENT DOCUMENTS 2501435 9/1982 France .

Primary Examiner—Siegfried H. Grimm
Attorney, Agent, or Firm—Oblon, Fisher, Spivak, McClelland & Maier

[57] ABSTRACT

A piezoelectric oscillator operating in the aperiodic or overtone mode comprising a first piezoelectric resonator having a resonance frequency at which the oscillator is to operate. One side of the first resonator is connected to ground, and the other side is connected through a second piezoelectric resonator to the base of a transistor. The second resonator has in common with the first resonator a mode at the resonance frequency, but its intrinsic quality factor is between 30 and 1000 times smaller than that of the first resonator. A capacitive divider bridge having a middle point is connected between the base of the transistor and ground. A third piezoelectric resonator having in common with said first resonator a mode at said resonance frequency, but whose intrinsic quality factor is of the same order of size as that of the second resonator, is connected between said middle point and the emitter of said transistor. A temperature sensing circuit is coupled to the oscillator and provides a control signal to a Varicap diode connected in the base circuit of the transistor, to compensate for frequency drift due to changes in temperature.

7 Claims, 3 Drawing Figures

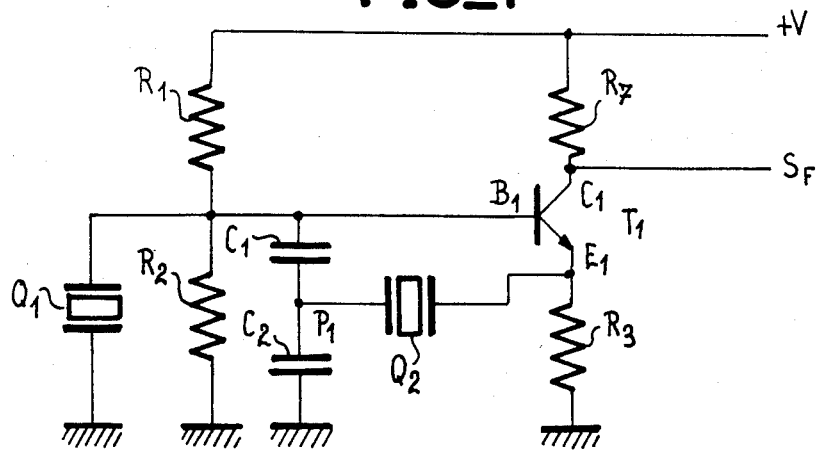
FIG_1
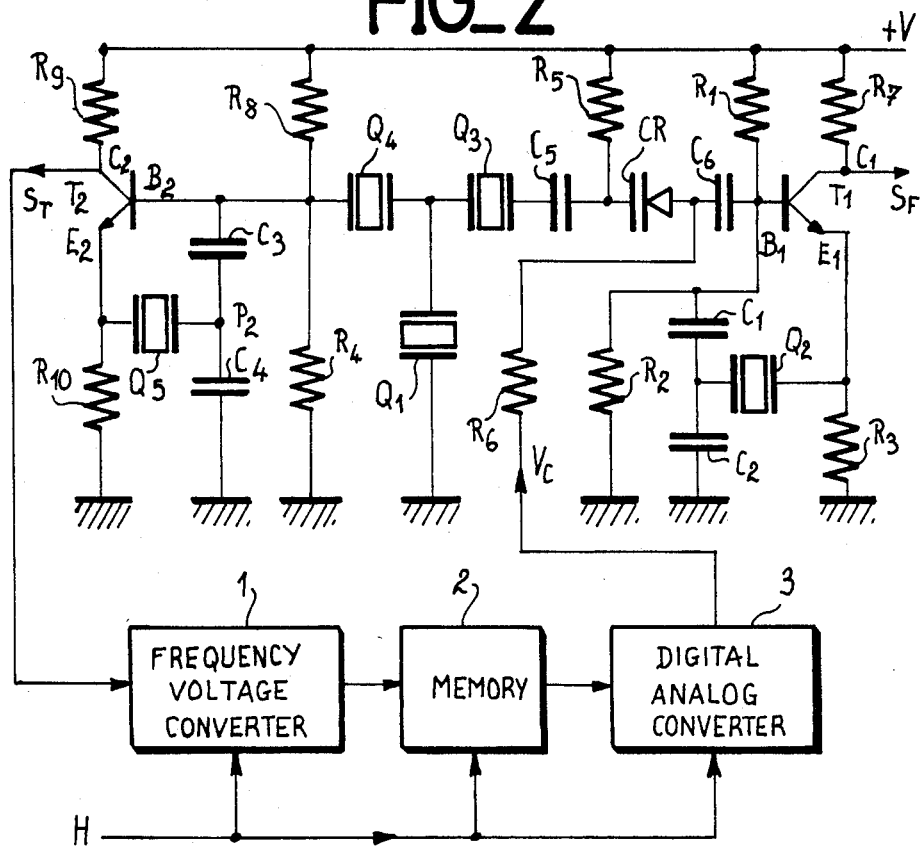
FIG_2

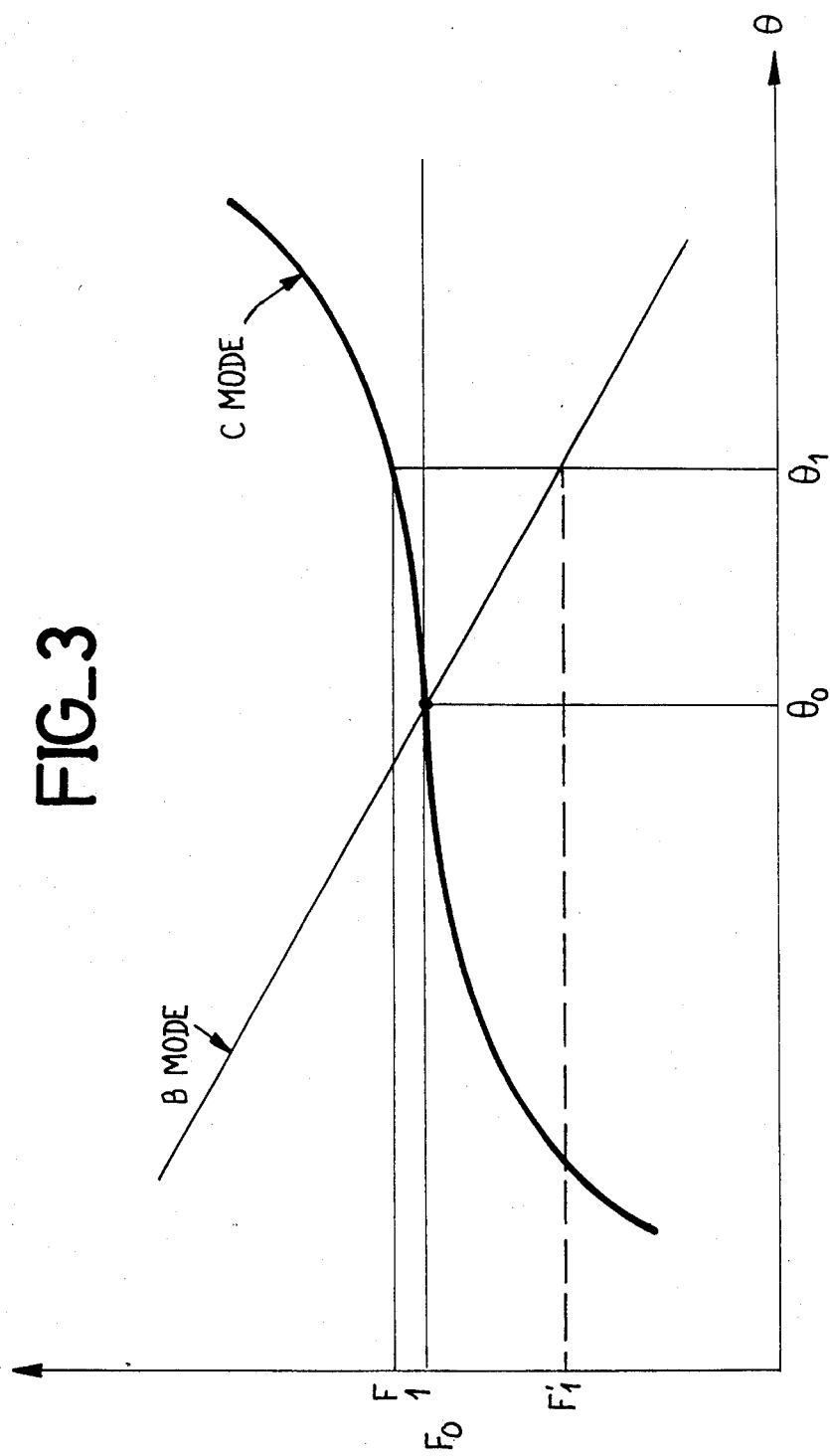
FIG_3

PIEZOELECTRIC OSCILLATOR WITH CRYSTAL FILTER AND TEMPERATURE COMPENSATION

BACKGROUND OF THE INVENTION

The present invention relates to a piezoelectric oscillator operating in the aperiodic mode, of the CLAPP type.

From the U.S. Pat. No. 4,484,157 belonging to the applicant a piezoelectric oscillator operating in the aperiodic or overtone mode is known, of the CLAPP type. This oscillator comprises a piezoelectric resonator having a resonance frequency at which the oscillator is to operate, with a first resonator being connected between the base of a transistor and ground, and a capacitive divider bridge having a so called middle point. The emitter of the transistor is loaded by way of a load resistor.

SUMMARY OF THE INVENTION

The object of the invention is to provide an oscillator of the above type having better selectivity provided by narrow band-pass filtering.

For this, it comprises a second piezoelectric resonator having in common with the first resonator a mode at said resonance frequency, but whose intrinsic quality factor is between 30 and a 1000 times smaller, the second resonator being connected between the middle point of the capacitive divider bridge and the emitter of the transistor.

In an advantageous variant, the second resonator is chosen so that the mode at said resonance frequency is the only mode common to the first and second resonators.

The intrinsic quality factor of the second resonator is advantageously of the order of 30 to a 100 times less than that of the first resonator and preferably of the order of a 100 times less.

Because of the high selectivity which is obtained, this variant is more particularly suitable in the case where the first resonator is used in one of these partial modes. It will in fact be recalled that the two modes of the same partial are separated by a relative frequency difference of the order of 10%.

In an improved embodiment, the oscillator comprises a third piezoelectric resonator having in common with the first resonator a mode at said resonance frequency, whose quality factor is of the same order of size as that of the second resonator, said third resonator being connected in series between the ungrounded terminal of the first resonator and the base of the transistor.

The oscillator is advantageously associated with a temperature detector and a servocontrol of the temperature of the first resonator.

In a variant, the oscillator comprises a Varicap diode connected in series with said third resonator so as to form a frequency control for the oscillator, it comprises a temperature detector and a compensation circuit producing a control voltage on the Varicap diode so that the frequency drift of the oscillator is compensated for. The first resonator may advantageously have, at said resonance frequency, a stable frequency mode depending on the temperature as well as a so called thermometric mode whose frequency varies with the temperature, the temperature detector then being formed by an oscillator operating in the thermometric mode of the first resonator and whose frequency varies therefore with the temperature thereof. The first resonator can for example be an SC cut quartz, the stable frequency mode being a C mode, and the thermometric mode a B mode. The C mode and the B mode may both belong to the fundamental F or both to a partial of the same rank.

In a preferred embodiment, the temperature sensitive oscillator employs a second transistor. A fourth piezoelectric resonator is connected between the ungrounded end of the first resonator and the base of the second transistor. A capacitive divider bridge having a so called middle point is connected between the base of the second transistor and ground, with the emitter of the second transistor being loaded by a second load resistor. A fifth piezoelectric resonator connects the second middle point to the emitter of the second transistor. The fourth and fifth resonators having in common a mode at the frequency of said thermometric mode of the first resonator, with a quality factor between 30 and a 1000 times smaller than the latter. The collector of the second transistor thereby produces a frequency voltage which varies substantially linearly with the temperature of the first resonator.

BRIEF DESCRIPTION OF THE DRAWINGS

The invention will be better understood from reading the following description given by way of non limitative example with reference to the drawings which show:

FIG. 1, one embodiment of an oscillator according to the invention;

FIG. 2 an embodiment of a temperature compensated oscillator according to the invention; and FIG. 3, curves representative of the temperature frequency drift in the case of an SC cut quartz.

DESCRIPTION OF THE PREFERRED EMBODIMENTS

In FIG. 1, a transistor $T_1$ is supplied with the voltage $+V$ at its collector $C_1$, a divider bridge $R_1,R_2$ biasing its base $B_1$. The emitter $E_1$ is loaded by a load resistor $R_3$. The piezoelectric resonator $Q_1$ is connected between the base $B_1$ of transistor $T_1$ and ground. A capacitive divider bridge $C_1,C_2$ having a so called middle point $P_1$ is also connected between the base $B_1$ of transistor $T_1$ and ground. A piezoelectric resonator $Q_2$ is connected between the middle point $P_1$ and the emitter $E_1$ of transistor $T_1$. The function of this resonator $Q_2$ is to form a band-pass filter at the operating frequency of the oscillator. Thus, resonator $Q_2$ must have a mode at the same frequency as the mode of resonator $Q_1$ chosen for determining a frequency of the oscillator. According to the invention, the band-pass filter is formed by choosing resonator $Q_2$ with a quality factor which is 30 to 1000 times smaller than that of resonator $Q_1$. Thus, it is certain that the oscillator will start up at the chosen frequency without being troubled by thermodrifting. It is very easy to provide a resonator with a quality factor smaller than that of resonator $Q_1$, since several parameters influence the quality factor of the resonator. Such parameters comprise for example the quality of the cut and the thickness and arrangement of the electrodes. In fact, thick electrodes at the position where the resonator vibrates cause a very considerable drop in the quality factor. In practice, it is high quality resonators which have high quality factors and are therefore very expensive. On the other hand, resonators having lower or much lower quality factors are easier to form and are less expensive. It is in any case possible to provide a resonator having a given quality factor. For example, with a resonator $Q_1$ made from quartz may be associated a resonator $Q_2$ made from lithium tantalate.

In FIG. 2, an oscillator such as shown in FIG. 1, is associated with a second oscillator having a high thermal drift. If we refer in fact to FIG. 3, an SC cut quartz has for its partial 3 a C mode whose frequency drift curve as a function of the temperature has a small slope close to a temperature $\theta°$ and a practically linear B mode over a large temperature range with high thermal drift. According to the invention, the C mode of the partial 3 of quartz $Q_1$ is used as temperature stable frequency reference and the slight thermal drift of this C mode is compensated for by using the B mode of the same quartz as temperature sensor. This design has the very important advantage of using, as temperature sensor, the quartz itself whose frequency it is desired to stabilize. It is then certain that the temperature measured is exactly that which is desired.

In so far as the oscillator part in the C mode is concerned, the same elements as those in FIG. 1 are shown with the same references. This oscillator has however in addition a frequency control circuit comprising a low value Varicap diode $C_R$ connected between two capacitors $C_5$ and $C_6$ in series with the base of transistor $T_1$. A biasing resistor $R_5$ biases the cathode of the varicap diode $C_R$ and a control voltage $V_C$ is applied to the anode of the varicap diode $C_R$ through a coupling resistor $R_6$. Such a frequency control circuit for slightly varying the frequency of the oscillator is moreover known per se. In addition, in the base circuit of transistor $T_1$ is connected a piezoelectric resonator $Q_3$ having a mode at the frequency of the C mode of resonator $Q_1$ corresponding to the desired frequency of the oscillator, with a quality factor of the order of 30 to 1000 times smaller and preferably 30 to 100 times smaller. Resonator $Q_3$ improves the separation between the C modes at which the main oscillator operates and the B mode at which the oscillator used as thermal sensor operates.

The thermal sensor oscillator has a CLAPP circuit similar to that of the oscillator of FIG. 1. The collector of a transistor $T_2$ is biased by a voltage B through a biasing resistor $R_9$ and its base by a divider bridge $R_8$, $R_4$. Furthermore, a capacitive divider bridge $C_3$, $C_4$ having a so called middle point $P_2$ is connected between the base $B_2$ of transistor $T_2$ and ground. The emitter $E_2$ of transistor $T_2$ is loaded by a load resistor $R_{10}$. The piezoelectric resonator is connected between the emitter $E_2$ and the middle point $P_2$. It has a mode whose frequency is that of the B mode close to the C mode at which the main oscillator operates. The same goes for a resonator $Q_4$ connected between the base $B_2$ and the ungrounded electrode of resonator $Q_1$. Resonators $Q_4$ and $Q_5$ have a quality factor 30 to 1000 times smaller and preferably a 100 times smaller than that of the B mode considered for resonator $Q_1$. The output voltage $S_T$ present at the collector $C_2$ of transistor $T_2$ is fed to a frequency-voltage converter 1 which outputs a digitalized voltage which is fed into a memory 2. Each value of the output voltage of converter 1 corresponds to an address in memory 2, at which address a stored voltage is read at a rate determined by a sampling clock H. This stored voltage is the reflection of the correspondance between the thermal drift curves in the B mode and the C mode of the quartz $Q_1$ and its value corresponds to that of the voltage $V_C$ which must be fed into the frequency variation circuit of the main oscillator for providing the thermal drift correction. For this, each value read in the memory at the rate of the sampling clock is fed to a digital-analog converter 3 whose output voltage $V_C$ is applied to the resistor $R_6$.

What is claimed is:

1. A piezoelectric oscillator of the Clapp type operating in the overtone mode comprising:
    a first piezoelectric resonator having a resonance frequency at which the oscillator is to operate, said first resonator being connected between the base of a transistor and ground, as well as a capacitive divider bridge connected between the base of said transistor and ground having a middle point and the emitter of the transistor being loaded by a load resistor;
    a second piezoelectric resonator having in common with the first piezoelectric resonator a mode at said resonance frequency, but whose intrinsic quality factor is between 30 and 1000 times smaller than that of the first piezoelectric resonator, said second piezoelectric resonator being connected between said middle point of the capacitive divider bridge and the emitter of said transistor; and
    a third piezoelectric resonator having in common with the first resonator a mode at said resonance frequency, but whose quality factor is of the same order of size as that of said second resonator, said third resonator being disposed in series between the ungrounded terminal of said first resonator and the base of said transistor.

2. The oscillator as claimed in claim 1, comprising a temperature detector and a temperature responsive control means for controlling the first resonator.

3. The oscillator as claimed in claim 1, wherein a Varicap diode is disposed in series with said third resonator so as to form a frequency control for said oscillator, comprising a temperature detector as well as a compensation circuit introducing a control voltage on said Varicap diode so that the frequency drift of the oscillator is compensated for.

4. The oscillator as claimed in claim 2, wherein said first resonator has, at said resonance frequency, a stable frequency mode depending on the temperature as well as a so called thermometric mode whose frequency varies with the temperature and wherein said temperature detector is formed by an oscillator operating in the thermometric mode of said first resonator and whose frequency thus varies as a function of the temperature thereof.

5. The oscillator as claimed in claim 4, wherein said first resonator is an SC cut quartz and said stable frequency mode is a C mode and the thermometric mode is a B mode.

6. The oscillator as claimed in claim 5, wherein said C mode and said B mode both belong to the fundamental F or to a partial of the same rank.

7. The oscillator as claimed in claim 4, wherein said temperature sensitive oscillator comprises a second transistor, a fourth piezoelectric resonator connected between the ungrounded end of the first resonator and the base of said second transistor, a second capacitive divider bridge having a second middle point and being connected between the base of said second transistor and ground, the emitter of said second transistor being loaded by a second load resistor and a fifth piezoelectric resonator connecting the second middle point to the emitter of said second transistor, the fourth and fifth resonators having in common a mode at the frequency of said thermometric mode of said first resonator, but with a quality factor between 30 and 1000 times less than this latter, the collector of said second transistor thus producing a voltage of a frequency varying substantially linearly with the temperature of said first resonator.

* * * * *